(12) United States Patent
Lee et al.

(10) Patent No.: US 11,112,665 B2
(45) Date of Patent: Sep. 7, 2021

(54) WIRING SUBSTRATE AND DISPLAY DEVICE INCLUDING WIRING SUBSTRATE

(71) Applicant: Samsung Display Co., Ltd., Yongin-Si (KR)

(72) Inventors: Ju Hyun Lee, Seongnam-si (KR); Gyung Min Baek, Yongin-si (KR); Hyun Eok Shin, Gwacheon-si (KR); Hong Sick Park, Suwon-si (KR); Sang Won Shin, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/276,529

(22) Filed: Feb. 14, 2019

(65) Prior Publication Data

US 2020/0026134 A1 Jan. 23, 2020

(30) Foreign Application Priority Data

Jul. 17, 2018 (KR) .......................... 10-2018-0083049

(51) Int. Cl.
*H01L 27/14* (2006.01)
*G02F 1/1362* (2006.01)
*H01L 27/12* (2006.01)

(52) U.S. Cl.
CPC ...... *G02F 1/136286* (2013.01); *H01L 27/124* (2013.01); *G02F 1/13629* (2021.01); *G02F 1/136222* (2021.01); *G02F 1/136295* (2021.01); *G02F 2201/38* (2013.01)

(58) Field of Classification Search
CPC .......................... H01L 27/124; G02F 1/136286
USPC ....................................... 257/59, 72
See application file for complete search history.

(56) References Cited

U.S. PATENT DOCUMENTS

| | | | |
|---|---|---|---|
| 8,766,252 B2 * | 7/2014 | Yamazaki | H01L 29/24 257/43 |
| 9,691,794 B1 | 6/2017 | Zhang | |
| 10,386,687 B2 * | 8/2019 | Yang | H01L 21/32139 |
| 2016/0104859 A1 * | 4/2016 | Kim | H01L 51/5092 257/40 |
| 2016/0380235 A1 * | 12/2016 | Kim | H01L 51/0074 257/40 |
| 2019/0086754 A1 | 3/2019 | Yang et al. | |

FOREIGN PATENT DOCUMENTS

| | | |
|---|---|---|
| KR | 10-2014-0130295 A | 11/2014 |
| KR | 10-2017-0113740 A | 10/2017 |
| KR | 10-2019-0031393 A | 3/2019 |

* cited by examiner

*Primary Examiner* — Tan N Tran
(74) *Attorney, Agent, or Firm* — Innovation Counsel LLP

(57) ABSTRACT

A display device may include a first base, a metal oxide layer overlapping a face of the first base, and a conductive metal layer directly contacting the metal oxide layer. The metal oxide layer may include molybdenum oxide. A side of the metal oxide layer may be oriented at a first angle relative to the face of the first base. A side of the conductive metal layer may be oriented at a second angle relative to the face of the first base. A size of the second angle may be in a range of 30° to 75°.

20 Claims, 12 Drawing Sheets

WIRING SUBSTRATE AND DISPLAY DEVICE INCLUDING WIRING SUBSTRATE

This application claims priority to Korean Patent Application No. 10-2018-0083049 filed on Jul. 17, 2018 in the Korean Intellectual Property Office; the disclosure of the Korean Patent Application is incorporated herein by reference in its entirety.

BACKGROUND

1. Field

The technical field relates to a wiring substrate and a display device including the wiring substrate.

2. Description of the Related Art

Modern display devices include liquid crystal display (LCD) devices, organic light emitting diode display (OLED) devices, and the like.

A display device may include a plurality of pixels for displaying different colors. The display device may also include driving signal wirings for transmitting driving signals to various functional electrodes arranged for the pixels.

The driving signal wirings are generally required to have low electric resistance, high thermal stability, and easy processability.

In a display device, wirings may reflect external light. The external light reflected by the wirings may cause significant deterioration of display quality, such as significant deterioration of contrast, of the display device.

SUMMARY

An embodiment may be related to a display device with a desirable aperture ratio, sufficient resolution, satisfactory display quality, and/or suppressed reflection of external light.

An embodiment may be related to a wiring substrate for a display device having both sufficient resolution and satisfactory display quality.

An embodiment of a display device includes a first base; and a first wiring layer disposed on the first base and including a conductive metal layer and a metal oxide layer mutually laminated; wherein the metal oxide layer includes molybdenum oxide, and the conductive metal layer has a tapered cross-sectional shape, and has a taper angle 30° to 75°.

An embodiment of a wiring substrate includes a first base; and a first wiring layer disposed on the first base and including a conductive metal layer and a metal oxide layer mutually laminated; wherein the metal oxide layer includes molybdenum oxide, and the conductive metal layer has a tapered cross-sectional shape, and has a taper angle 30° to 75°.

An embodiment of a display device includes a first base; and a first wiring layer disposed on the first base and including a conductive metal layer and a metal oxide layer mutually laminated; wherein the metal oxide layer includes $Mo_xTa_yO_z$, and the conductive metal layer has a tapered cross-sectional shape, and a content of tantalum in metal atoms is 0.5 at % to 20 at %.

An embodiment may be related to a display device. The display device may include a first base, a metal oxide layer overlapping a face of the first base, and a conductive metal layer directly contacting the metal oxide layer. The metal oxide layer may include molybdenum oxide. A side of the metal oxide layer may be oriented at a first angle relative to the face of the first base. A side of the conductive metal layer may be oriented at a second angle relative to the face of the first base. A size of the second angle may be in a range of 30 degrees to 75 degrees.

A light reflectance of the metal oxide layer may be lower than a light reflectance of the conductive metal layer.

A first wiring layer of the display device may include the metal oxide layer and the conductive metal layer. A light reflectance of the first wring layer to light having a wavelength of 550 nm incident from the face of the first base may be 6.0% or less.

A maximum thickness of the metal oxide layer in a direction perpendicular to the face of the first base may be in a range of 100 Å to 2000 Å.

The metal oxide layer may be disposed directly on the first base and disposed between the conductive metal layer and the first base.

The first angle may be smaller than the second angle.

The size of the second angle may be in a range of 45 degrees to 70 degrees.

The side of the metal oxide layer may be directly connected to the side of the conductive metal layer.

The metal oxide layer may directly contact a face of the conductive metal layer and may protrude beyond the face of the conductive metal layer in a direction parallel to the face of the first base The metal oxide layer further may include tantalum. A content of the tantalum in metal atoms may be in a range of 0.5 at % to 12 at % in the metal oxide layer.

The conductive metal layer may include a first metal layer and a second metal layer. The first metal layer may be disposed between the metal oxide layer and the second metal layer. The second metal layer may have higher electrical conductivity than the first metal layer.

The conductive metal layer may include a first metal layer and a second metal layer. The first metal layer may be disposed between the metal oxide layer and the second metal layer. The second metal layer has higher electrical conductivity than the first metal layer.

A first wiring layer of the display device may include the metal oxide layer and the conductive metal layer. A light reflectance of the first wring layer to light having a wavelength of 550 nm incident from the face of the metal oxide layer may be 6.0% or less.

The conductive metal layer may include a first metal layer and a second metal layer. The second metal layer may be disposed between the first metal layer and the metal oxide layer and has higher electrical conductivity than the first metal layer.

A maximum thickness of the metal oxide layer in a direction perpendicular to the face of the first base may be greater than a maximum thickness of the first metal layer in the direction and may be smaller than a maximum thickness of the second metal layer in the direction.

The maximum thickness of the metal oxide layer in the direction may be in a range of 100 Å to 2000 Å.

The first metal layer may include a refractory metal. The second metal may include at least one of copper and silver.

A first face of the first metal layer and a first face of the second metal layer may be positioned between a second face of the first metal layer and a second face of the second metal layer. The first face of the first metal layer may be wider that the first face of the second metal layer in a direction parallel to the face of the first base.

The metal oxide layer may directly contact a face of the conductive metal layer and may protrude beyond the conductive metal layer in a direction parallel to the face of the first base.

An embodiment may be related to a wiring substrate. The wiring substrate may include a first base, a metal oxide layer overlapping a face of the first base, and a conductive metal layer directly contacting the metal oxide layer. The metal oxide layer may include molybdenum oxide. A side of the conductive metal layer may be oriented at an angle relative to the face of the first base. A size of the angle may be in a range of 30 degrees to 75 degrees.

An embodiment may be related to a display device. The display device may include a first base, a conductive metal layer overlapping a face of the first base, and a metal oxide layer directly contacting the conductive metal layer. The metal oxide layer may include $Mo_xTa_yO_z$. A side of the conductive metal layer may be oriented at an acute angle relative to the face of the first base. A content of tantalum in metal atoms may be in a range of 0.5 at % to 20 at % in the conductive metal layer.

DETAILED DESCRIPTION

Figure 1:
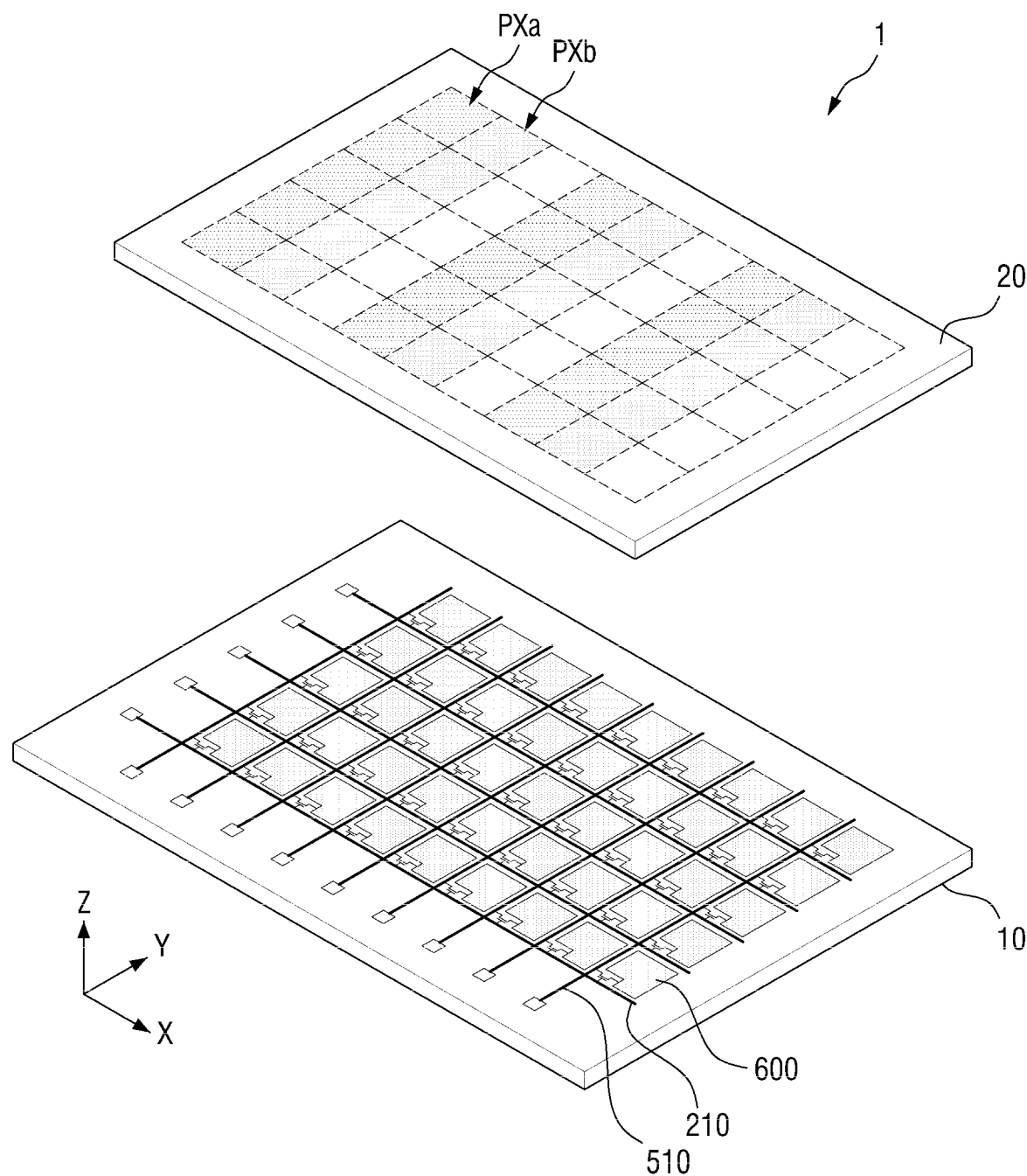
FIG. 1 is an exploded perspective view of a display device according to an embodiment.

Example embodiments are described with reference to the accompanying drawings. Practical embodiments may be embodied in many different forms and should not be construed as being limited to the described embodiments. Like reference numerals may refer to like elements.

The terminology used herein is for the purpose of describing particular embodiments. As used herein, the singular forms "a", "an" and "the" may include the plural forms as well, unless the context clearly indicates otherwise. The terms "comprises" and/or "comprising" may specify the presence of stated features steps, and/or components, but do not preclude the presence or addition of one or more other features steps, and/or components.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on", "connected to," or "coupled to" a second element, the first element can be directly on, connected, or coupled to the second element, or one or more intervening elements may be present between the first element and the second element. When a first element is referred to as being "directly on", "directly connected to," or "directly coupled to" a second element, there are no intended intervening elements (except environmental elements such as air) present between the first element and the second element. The term "and/or" may include any and all combinations of one or more of the associated listed items.

The term "connect" may mean "electrically connect"; the term "isolate" may mean "electrically isolate"; the term "insulate" may mean "electrically insulate"; the term "contact" may mean "directly contact" or "direct contact."

FIG. 1 is an exploded perspective view of a display device according to an embodiment.

Referring to FIG. 1, a display device 1 includes a display panel 1a and optionally a light source unit 1b providing light to the display panel 1a.

The display panel 1a includes pixels PXa and PXb, and the pixels PXa and PXb may be arranged in a substantially matrix form along a first direction X and a second direction Y. A pixel may express one or more of predetermined primary colors. One pixel may be a minimum unit capable of expressing one or more colors independent of other pixels. The primary colors may include red, green, and blue. For example, the first pixel PXa and the second pixel PXb arranged along the first direction X may express different primary colors.

The display panel 1a may include driving signal wirings, and the driving signal wirings may include a gate signal wiring 210 extending in the first direction X and a data signal wiring 510 extending in the second direction Y and isolated from the gate signal wiring 210. Each of the gate signal wiring 210 and the data signal wiring 510 is connected to a driving unit (not shown) and to a pixel electrode 600 disposed in a pixel to transmit a driving signal from the driving unit to the pixel.

The light source unit 1b may be disposed at one side of the display panel 1a to provide light having a specific wavelength to the display panel 1a. For example, the light source unit 1b may be disposed at the upper side of the display panel 1a. In this case, the lower surface of the display panel 1a may be a display surface, and an image can be displayed on the display surface. As another example, the light source unit 1b may be disposed at the lower side of the display panel 1b. In this case, the upper surface of the display panel 1a may be a display surface, and an image can be displayed on the display surface.

The light source unit 1b may include a light source (not shown) directly emitting light and a light guide plate (not shown) guiding the path of light received from the light source and emitting the light toward the display panel 1a. The light guide plate may have a high light transmittance and may include at least one of a glass material, a quartz material, and a plastic material such as polyethylene terephthalate.

The light source may be a light emitting diode (LED) or an organic light emitting diode (OLED). For example, the light source may emit a blue light or a white light.

Although not shown in the drawings, at least one optical sheet may be disposed between the display panel 1a and the light source unit 1b. The optical sheet may include at least one of a prism sheet, a diffusion sheet, a polarizing sheet (or a reflective polarizing sheet), a lenticular lens sheet, and a micro lens sheet. The optical sheet may improve the display quality of the display device 1 by modulating the optical characteristics of light provided from the light source unit 1b and traveling toward the display panel 1a. For example, the optical sheet may collect light, diffuse/scatter light, and/or modulate polarizing characteristics.

Figure 2:
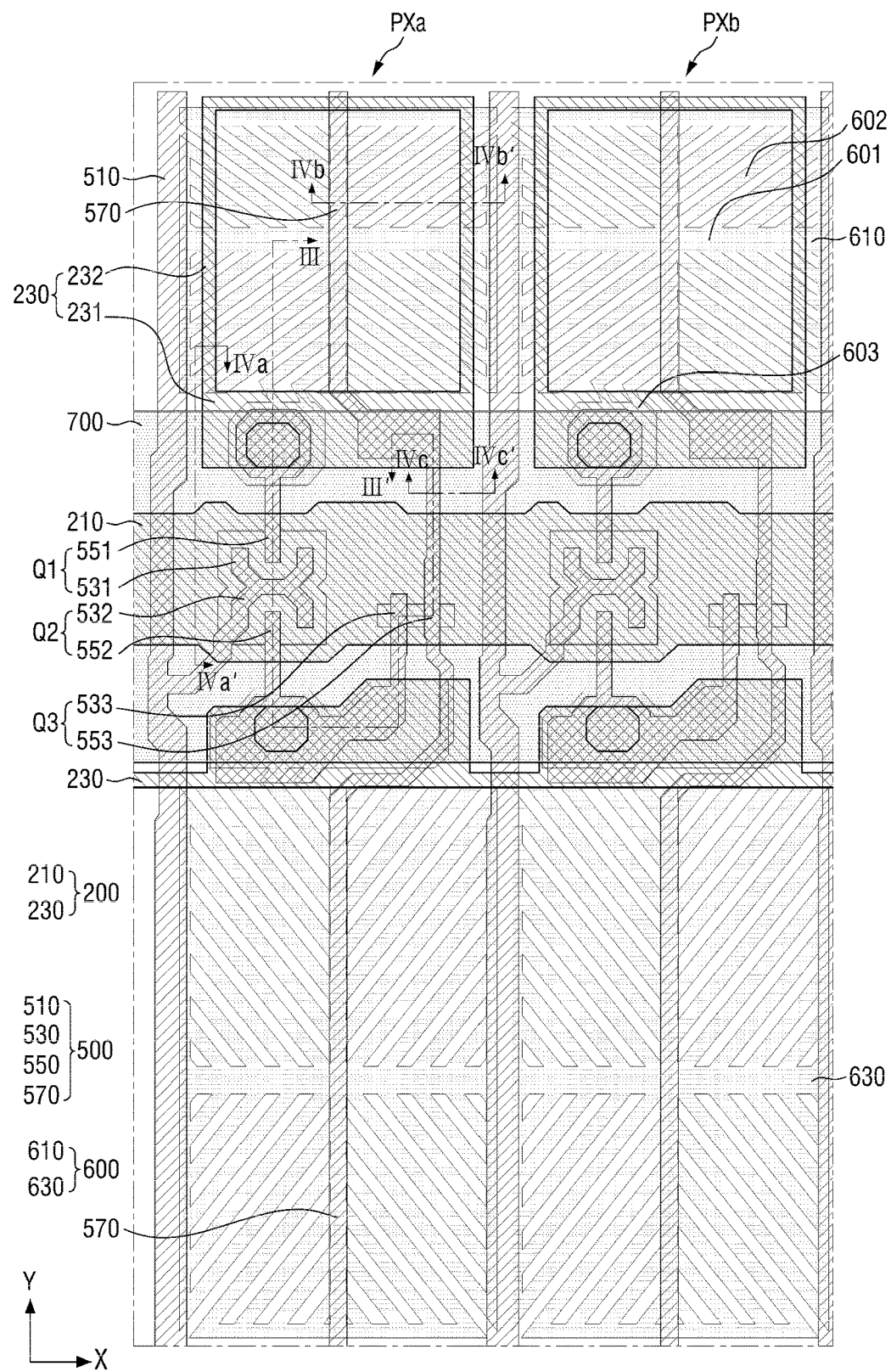
FIG. 2 is a layout view (or plan view) of pixels included in the display device of FIG. 1 according to an embodiment.
Figure 3:
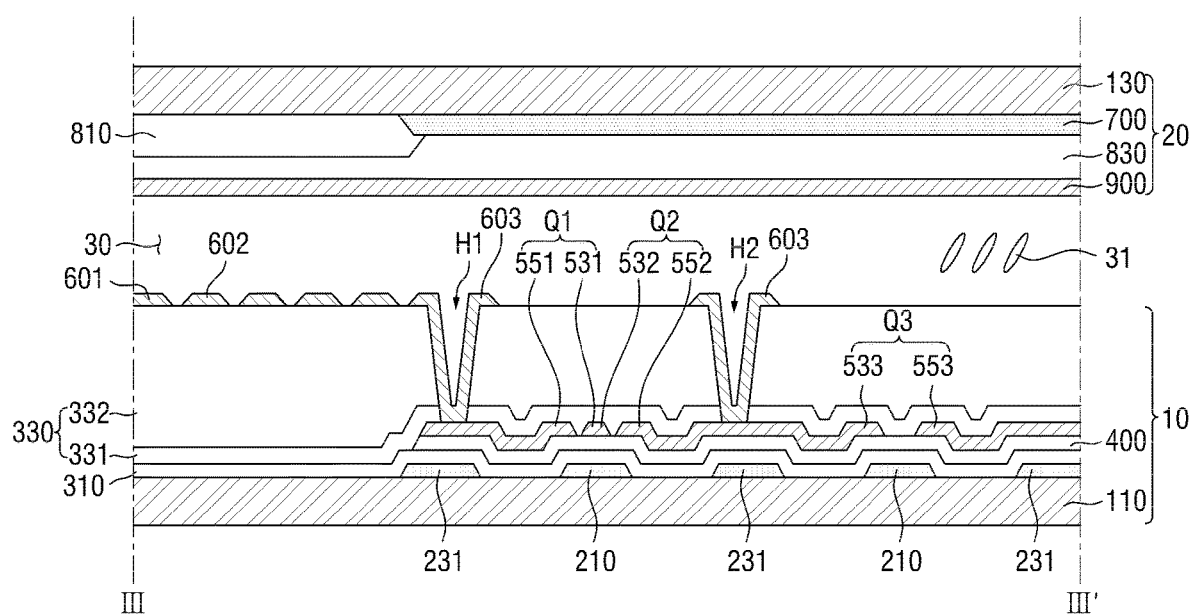
FIG. 3 is a cross-sectional view taken along the line III-III' of FIG. 2 according to an embodiment.

FIG. 2 is a layout view (or plan view) of pixels included in the display device of FIG. 1 according to an embodiment. FIG. 3 is a cross-sectional view taken along the line III-III' of FIG. 2 according to an embodiment.

Referring to FIGS. 1 to 3, the display panel 1a may include a lower substrate 10, an upper substrate 20 overlapping the lower substrate 10, and a liquid crystal layer 30 disposed between the substrates 10 and 20. The liquid crystal layer 30 may be encapsulated by the lower substrate 10, the upper substrate 20, and an encapsulating member (not shown) that attach these substrates 10 and 20 to each other. The lower substrate 10 may be a wiring substrate provided with driving signal wirings for driving the display panel 1a, and the upper substrate 20 may be a color conversion substrate provided with a color conversion pattern.

The lower substrate 10 may include a first base 110 (or a first base substrate), a first wiring layer 200 (indicated in FIG. 2), a first insulating layer 310, an active layer 400, a second wiring layer 500 (indicated in FIG. 2), a second insulating layer 330, and a pixel electrode 600 (indicated in FIG. 2).

The first base 110 may be a transparent insulating substrate. For example, the first base 110 may be a substrate made of a glass material, a quartz material, or a translucent plastic material. In an embodiment, the first base 110 may have flexibility, and the display device 1 may be a curved display device.

The first wiring layer 200 may be disposed on the first base 110. The first wiring layer 200 may be disposed directly on the first base 110. The first wiring layer 200 may include a gate signal wiring 210 and a sustain electrode 230. The gate signal wiring 210 and the sustain electrode 230 may be disposed on the same layer. For example, the gate signal wiring 210 and the sustain electrode 230 may have the same structure, may be made of the same material, and may be simultaneously formed through one process (for example, a mask process).

The gate signal wiring 210 may extend along substantially the first direction X. The gate signal wiring 210 may transmit a gate driving signal provided from a gate driving unit (not shown) to a switching element disposed in each of the pixels PXa and PXb. For example, the pixels arranged along the first direction X may share one gate signal wiring 210.

A part of the gate signal wiring 210 may form the gate electrode of the switching element. For example, parts of the gate signal wiring 210 may form control terminals (or control electrodes) of a first switching element Q1, a second switching element Q2, and a third switching element Q3. A control terminal of a switching element may protrude from the gate signal wiring 210.

The sustain electrode 230 may overlap a part of the second wiring layer 500 and/or a part of the pixel electrode 600. The sustain electrode 230 may form a storage capacitor together with the second wiring layer 500 (and/or the pixel electrode 600) and a dielectric layer (or an insulating layer) interposed between the sustain electrode 230 and the second wiring layer 500 (and/or the pixel electrode 600). The storage capacitor may maintain a voltage applied to the pixel electrode 600 during one frame (or a specific time). The sustain electrode 230 may have a partially extended portion. In this case, an overlap area with the second wiring layer 500 and the pixel electrode 600 may be maximized, the capacity of the storage capacitor may be maximized, and a voltage may be stably maintained for one frame.

In an embodiment, the sustain electrode 230 may partially overlap the edge of a first sub-pixel electrode 610. When the first sub-pixel electrode 610 has a substantially rectangular planar shape, the sustain electrode 230 may have a substantially square band including portions 231 extending in the first direction X and portions 232 extending in the second direction Y. In embodiments, the sustain electrode 230 may have other configurations.

In embodiments, the first wiring layer 200 (for example, the gate signal wiring 210 and the sustaining electrode 230) may include a conductive metal layer and a metal oxide layer. The first wiring layer 200 may have a laminate structure in which a conductive metal layer and a metal oxide layer are laminated. The first insulating layer 310 may be disposed on the first wiring layer 200 over the entire surface of the first base 110. The first insulating layer 310 may include an insulating material to insulate components from each other. The first insulating layer 310 may be a gate insulating layer for insulating control terminals (or gate electrodes) of switching elements Q1, Q2, and Q3 from a channel layer (that is, an active layer 400). The first insulating layer 310 may include silicon nitride, silicon oxide, silicon oxynitride, or silicon oxynitride.

The active layer 400 may be disposed on the first insulating layer 310. The active layer 400 may include a semiconductor material. For example, the active layer 400 may include amorphous silicon or polycrystalline silicon, or may include an oxide semiconductor. A part of the active layer 400 may form a channel of the switching element. For example, parts of the active layer 400 may form channels of a first switching device Q1, a second switching device Q2, and a third switching device Q3, and one or more of the channels may be turned on or turned off according to a voltage applied to the gate signal wiring 210. At least a part of the active layer 400 may extend in substantially the second direction Y and overlap the data signal wiring 510.

The second wiring layer 500 may be disposed on the active layer 400. The second wiring layer 500 may include a data signal wiring 510, a source electrode layer 530, and a drain electrode layer 550, and may further include a reference voltage wiring 570. The data signal wiring 510, the source electrode layer 530, the drain electrode layer 550, and the reference voltage wiring 570 may be disposed on the same layer. For example, the data signal wiring 510, the source electrode layer 530, the drain electrode layer 550, and the reference voltage wiring 570 may have the same structure, may be made of the same material, and may be simultaneously formed through one process.

The data signal wiring 510 may extend along substantially the second direction Y. The data signal wiring 51 may transmit a data driving signal provided from a data driving unit (not shown) to a switching element disposed in each of pixels arranged in a same pixel column along the second direction Y.

The source electrode layer 530 may include a first source electrode 531, a second source electrode 532, and a third source electrode 533. The first source electrode 531, the second source electrode 532, and the third source electrode 533 may serve as the input terminals of the first switching device Q1, the second switching device Q2, and the third switching device Q3, respectively.

The first source electrode 531 may protrude from the data signal wiring 510 and may be formed integrally with the data signal line 510. The first source electrode 531 may be spaced from the first drain electrode 551 on the gate signal wiring 210 and the active layer 400.

Similarly, the second source electrode 532 may protrude from the data signal wiring 510 and may be formed integrally with the data signal wiring 510 and the first source 531. The second source electrode 532 may be spaced from the second drain electrode 552 on the gate signal wiring 210 and the active layer 400.

The third source electrode 533 may extend from the second drain electrode 552 and may be formed integrally with the second drain electrode 552. The third source electrode 533 may be spaced from the third drain electrode 553 on the gate signal wiring 210 and the active layer 400.

The drain electrode layer 550 may include a first drain electrode 551, a second drain electrode 552, and a third drain electrode 553. The first drain electrode 551, the second drain electrode 552, and the third drain electrode 553 may serve as the output terminals of the first switching device Q1, the second switching device Q2, and the third switching device Q3, respectively.

The first drain electrode 551 may be spaced from the first source electrode 531 on the gate signal wiring 210 and the active layer 400. The first drain electrode 551 may be electrically connected to a first sub-pixel electrode 610 (which includes portions 601, 602, and 603) through a first contact hole H1.

Similarly, the second drain electrode 552 may be spaced from the second source electrode 532 on the gate signal wiring 210 and the active layer 400. The second drain electrode 552 may be electrically connected to the second sub-pixel electrode 630 through a second contact hole H2. The second drain electrode 552 may be integrally formed with the third source electrode 533.

The third drain electrode 553 may be spaced from the third source electrode 533 on the gate signal wiring 210 and the active layer 400.

The reference voltage wiring 570 may extend in substantially the second direction (Y). For example, a portion of the reference voltage wiring 570, the portion extending in the second direction Y, may overlap a stem portion 601 of the pixel electrode 600. When the reference voltage wiring 570 overlap the stem portion 601 of the pixel electrode 600, the luminance deterioration due to the reference voltage wiring 570 passing through an opening region can be minimized. A reference voltage may be applied to the reference voltage wiring 570.

In an embodiment, a part of the reference voltage wiring 570 may partially form the third drain electrode 553. For example, the reference voltage wiring 570 may simultaneously serve as an output terminal of the third switching device Q3. In an embodiment, the reference voltage wiring 570 and the third drain electrode 553 may be physically separated from each other, but may also be electrically connected to each other.

In embodiments, the second wiring layer 500 (for example, the data signal wiring 510, the source electrode layer 530, the drain electrode layer 550, and the reference voltage wiring 570) may include a conductive metal layer and a metal oxide layer. The second wiring layer 500 may have a laminate structure in which a conductive metal layer and a metal oxide layer are laminated.

The second insulating layer 330 may be disposed on the second wiring layer 500 over the entire surface of the first base 110. The second insulating layer 330 may include an insulating material. The second insulating layer 330 may isolate the second wiring layer 500 from the pixel electrode 600. The second insulating layer 330 may have a laminate structure of a plurality of layers. For example, the second insulating layer 330 may have a double-layer structure including a protective layer 331 made of an inorganic material and a planarization layer 332 made of an organic material.

Contact holes may be formed in the second insulating layer 330. For example, the first contact hole H1 may penetrate the second insulating layer 330 to partially expose the first drain electrode 551, and the second contact hole H2 may penetrate the second insulating layer 330 to partially expose the second drain electrode 552.

The pixel electrode 600 may be disposed on the second insulating layer 330. The pixel electrode 600 may form an electric field in a liquid crystal layer 30 together with a common electrode 900 to control the alignment direction of liquid crystals 31 in the corresponding pixel. The pixel electrodes 600 may be disposed in the respective pixels PXa and PXb, and voltages may be applied to the pixel electrodes 600 independently of each other. The pixel electrode 600 may be a transparent electrode made of a transparent conductive material. Examples of the material for forming the transparent electrode may include indium tin oxide (ITO) and indium zinc oxide (IZO).

In an embodiment, in one pixel, the pixel electrode 600 may include a first sub-pixel electrode 610 and a second sub-pixel electrode 630 spaced from each other. The planar area occupied by the first sub-pixel electrode 610 may be smaller than the planar area occupied by the second sub-pixel electrode 630.

Each of the first sub-pixel electrode 610 and the second sub-pixel electrode 630 may have a substantially rectangular shape in a plan view, and may be a pattern electrode having domain dividing means. For example, each of the first sub-pixel electrode 610 and the second sub-pixel electrode 630 may include a stem portion 601, a plurality of branch portions 602, and a connection portion 603 extending from the branch portions 602.

The stem portion 601 may be formed in a substantially cross shape. The stem portion 601 may overlap the reference voltage wiring 570 extending in substantially the second direction Y. The branch portions 602 may extend in a direction inclined from the cross-shaped stem portion 601, for example, in a direction of about 45° with respect to the extending direction of the stem portion 601. That is, each of the first sub-pixel electrode 610 and the second sub-pixel electrode 630 may have four domains divided by the stem portion 601 and having different alignment directions of the branch portions 602. In this case, the liquid crystal control ability of the display device 1 may be improved, the viewing angle of the display device 1 may be improved, and the luminance and response speed of the display device 1 may be improved.

The connection portion 603 of the first sub-pixel electrode 610 may electrically connect the first sub-pixel electrode 610 and the first drain electrode 551 through the first contact hole H1, and the connection portion 603 of the second sub-pixel electrode 630 may electrically connect the second sub-pixel electrode 630 and the second drain electrode 552 through the second contact hole H2.

The first switching element Q1, the second switching element Q2, and the third switching element Q3 share one gate signal wiring 210 and may be controlled at the same time. A data voltage provided from the data signal wiring 510 may be applied to the first sub-pixel electrode 610 through the first switching element Q1. Since the second drain electrode 552 of the second switching element Q2 is electrically connected to the reference voltage wiring 570 through the third switching element Q3, a predetermined voltage having a value between the data voltage provided from the data signal wiring 510 and the reference voltage provided from the reference voltage wiring 570 may be applied to the second sub-pixel electrode 630. Therefore, a voltage having a relatively lower magnitude than that applied to the first sub-pixel electrode 610 may be applied to the second sub-pixel electrode 630. The first sub-pixel electrode 610 and the second sub-pixel electrode 630 to which different voltages are applied are disposed in one pixel to improve the side visibility of the display device 1.

In FIG. 2, the edge of the first sub-pixel electrode 610 overlaps the sustain electrode 230. In an embodiment, the edge of the second sub-pixel electrode 630 may overlap the sustain electrode 230. In an embodiment, both the first sub-pixel electrode 610 and the second sub-pixel electrode 630 may overlap the sustain electrode 230.

The upper substrate 20 may include a second base 130, a light blocking member 700 disposed on one surface (lower surface in the drawing) of the second base 130, a color conversion pattern 810 disposed on the second base 130, an overcoat layer 830 disposed on the color conversion pattern 810 and the light blocking member 700, and a common electrode 900 disposed on the overcoat layer 830.

The second base 130 may be a transparent substrate. The first base 110 and the second base 130 may be made of the same material or different materials.

The light blocking member 700 may be disposed on the second base 130. The light blocking member 700 may be made of a material capable of blocking light in a visible light wavelength band. The light blocking member 700 may overlap the first switching element Q1, the second switching element Q2, and the third switching element Q3, thereby preventing light leakage in an unintended area.

The light blocking member 700 may have a line shape extending in the first direction X and may overlap the switching elements Q1 to Q3. Further, the light blocking member 700 may partially overlap the sustain electrode 230, a part of the active layer 400, and a part of the data signal wiring 510. T gate signal wiring 210 may be completely covered by the light blocking member 700. In FIG. 3, the light blocking member 700 is included in the upper substrate 20. In an embodiment, the light blocking member 700 may be included in the lower substrate 10. In an embodiment, the light blocking member 700 may be unnecessary.

The color conversion pattern 810 may partially overlap the light shielding member 700 and may overlap the pixel electrode 600. A color conversion pattern 810 may be disposed at a position corresponding to each of the pixels PXa and PXb. The light having passed through the color conversion pattern 810 may be in a specific wavelength band. Therefore, the pixels PXa and PXb of the display device 1 may express different colors.

The color conversion pattern 810 may be a color filter including a colorant such as a dye or a pigment. The colorant may selectively absorb a specific wavelength band of incident light. The color conversion pattern 810 may absorb light of a specific wavelength band in incident light and selectively transmit light of another specific wavelength band in incident light.

The color conversion pattern 810 may be a wavelength shift member including a wavelength shift material such as a quantum dot material or a fluorescent material. The wavelength shift material may convert or shift a peak wavelength of incident light to another specific peak wavelength. The color conversion pattern 810 may emit light having a specific peak wavelength after absorbing at least a part of incident light.

The overcoat layer 830 may be disposed on the color conversion pattern 810 over the entire surface of the second base 130. The overcoat layer 830 may planarize a plurality of components laminated on the second base 130 to provide a surface on which the common electrode 900 is to be disposed.

The common electrode 900 may be disposed on the overcoat layer 830. The common electrode 900 may be integrally formed for all the pixels PXa and PXb, and a common voltage may be applied to the common electrode 900. The common electrode 900 may be a transparent electrode.

The liquid crystal layer 30 may include initially aligned liquid crystals 31. For example, the liquid crystals 31 may have a negative dielectric anisotropy and may be vertically aligned in an initial alignment state. The liquid crystals 31 may have a predetermined pretilt angle in the initial alignment state. When an electric field is formed between the pixel electrode 600 and the common electrode 900, the liquid crystals 31 may change the amount of light transmitted through the liquid crystal layer 30. As another example, the liquid crystals 31 may have a positive dielectric anisotropy and may be horizontally aligned in the initial alignment state. When an electric field is formed, the liquid crystals 31 may change the transmission of light.

Figure 4:
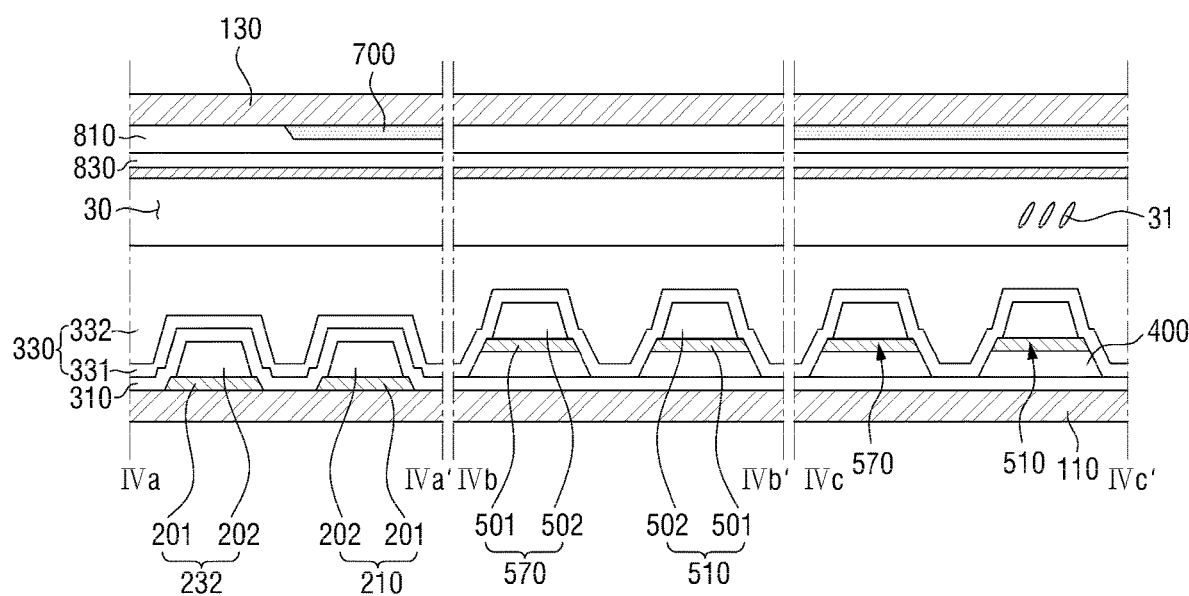
FIG. 4 is cross-sectional view taken along the line IVa-IVa', IVb-IVb', and IVc-IVc' of FIG. 2 according to an embodiment.
Figure 5:
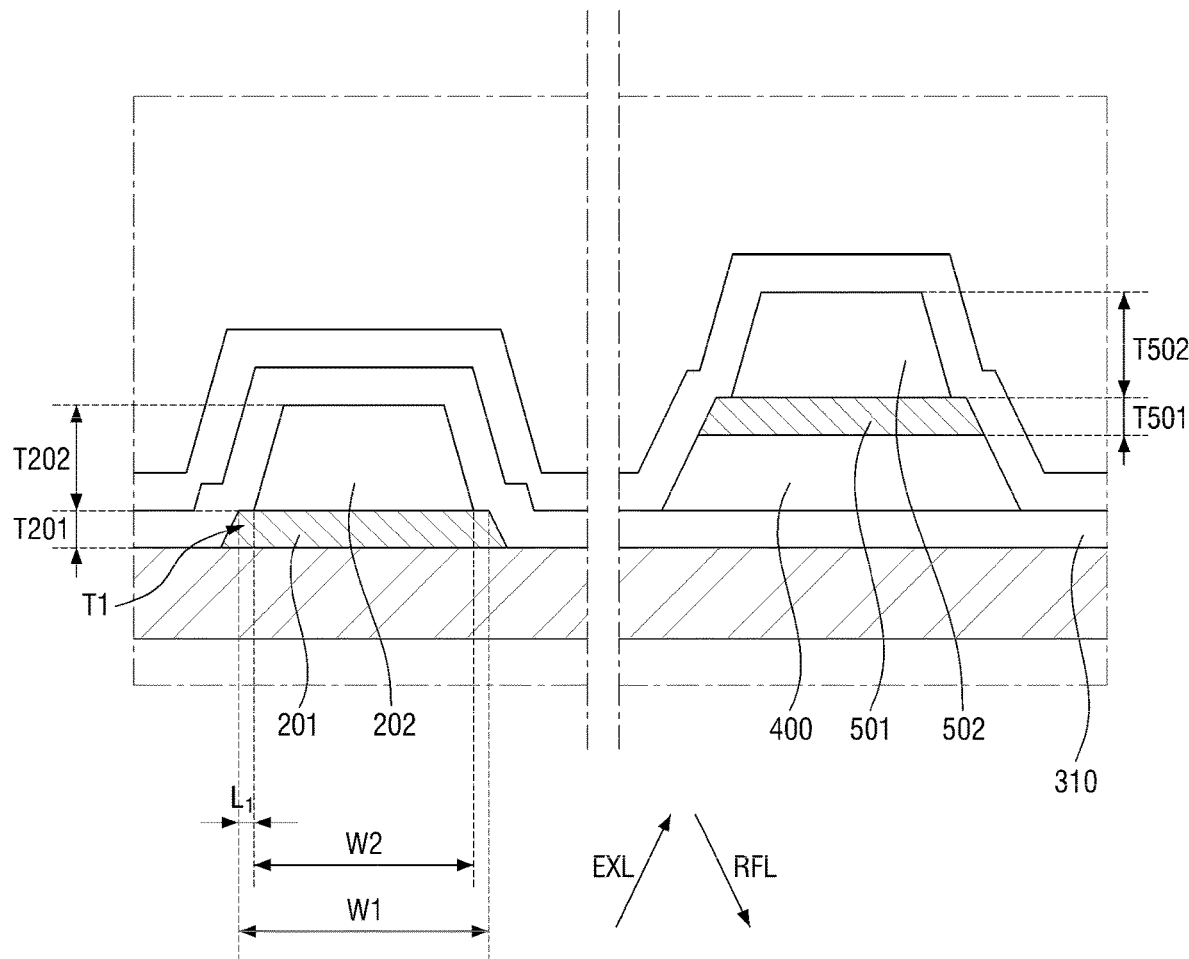
FIG. 5 is a cross-sectional view showing a first wring layer and a second wiring layer included in the pixels of FIG. 2 according to an embodiment.
Figure 6:
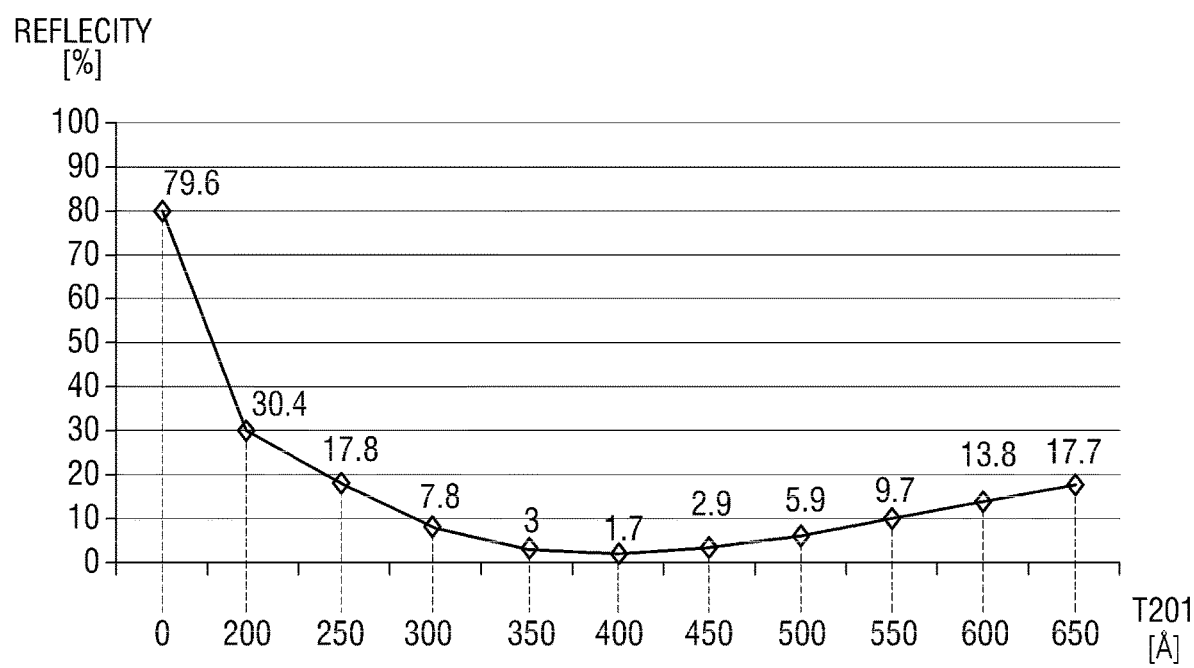
FIG. 6 is a graph showing light reflectance values in a visible light wavelength band with respect to thickness values of a metal oxide layer included in the first wiring layer of FIG. 5 according to an embodiment.

FIG. 4 is cross-sectional view taken along the line IVa-IVa', IVb-IVb', and IVc-IVc' of FIG. 2 according to an embodiment. FIG. 5 is a cross-sectional view showing a first wring layer and a second wiring layer included in the pixel of FIG. 2 according to an embodiment. FIG. 6 is a graph showing light reflectance values in a visible light wavelength band with respect to thickness values of a metal oxide layer included in the first wiring layer of FIG. 5 according to an embodiment.

In FIG. 4, the cross-section taken along the line IVa-IVa' represents the sustain electrode 230 and the gate signal line 210, the cross-section taken along the line IVb-IVb' represents the reference voltage wiring 570 and the data signal wiring 510 in an area not overlapping the light blocking member 700, and the cross-section taken along the line IVb-IVb' represents the reference voltage wiring 570 and the data signal wiring 510 in an area overlapping the light blocking member 700.

Referring to FIGS. 1 to 6, the first wiring layer 200 may have a laminate structure in which a first metal oxide layer 201 and a first conductive metal layer 202 are laminated, and the second wiring layer 500 may have a laminate structure in which a second metal oxide layer 501 and a second conductive metal layer 502 are laminated. In FIGS. 4 and 5, the first wiring layer 200 includes the first metal oxide layer 201 and the first conductive metal layer 202, and the second wiring layer 500 includes the second metal oxide layer 501 and the second conductive metal layer 502. In embodiments, the second wiring layer 500 may not include the second metal oxide layer 501, or the first wiring layer 200 may not include the second metal oxide layer 201.

The first wiring layer 200 may include a first metal oxide layer 201 and a first conductive metal layer 202.

The first metal oxide layer 201 may be disposed on the first base 110. The first metal oxide layer 201 may be a single layer. The first metal oxide layer 201 may include a material having a higher light absorbance and a smaller light reflectance than the first conductive metal layer 202.

In embodiments, the first metal oxide layer 201 may include molybdenum oxide (MoOx). For example, the first metal oxide layer 201 may include molybdenum dioxide ($MoO_2$). As another example, the first metal oxide layer 201 may include molybdenum dioxide ($MoO_2$) and molybdenum trioxide ($MoO_3$).

The refractive index of molybdenum oxide may be about 2.55, and the absorption coefficient (or extinction coefficient, k) of molybdenum oxide may be 3697.6 $cm^{-1}$. In this case, the refractive index of the first metal oxide layer 201 including molybdenum oxide may be in a range of 2.2 to 2.6, and the absorption coefficient of the first metal oxide layer 201 may increase in proportion to the increase in thickness and may be 0.40 to 0.90.

The first conductive metal layer 202 may be disposed on the first metal oxide layer 201. The first conductive metal layer 202 may be disposed directly on the first metal oxide layer 201. The first conductive metal layer 202 may include a metal material having low specific resistance and excellent electrical conductivity. For example, the first conductive metal layer 202 may include copper (Cu), silver (Ag), aluminum (Al), or an alloy. The first conductive metal layer 202 may exhibit opaque properties. For example, the first conductive metal layer 202 may be a copper layer including only copper, or may be a single layer including an alloy of copper.

In an embodiment, the refractive index of the first metal oxide layer 201 may be greater than that of the first conductive metal layer 202. For example, the refractive index of the first metal oxide layer 201 to light in the visible light wavelength band may be in a range of 2.2 to 2.6, and the refractive index of the first metal oxide layer 201 to light having a wavelength of 550 nm may be in a range of 2.2 to 2.3.

In an embodiment, the thickness T201 of the first metal oxide layer 201 may be smaller than the thickness T202 of the first conductive metal layer 202. The first metal oxide layer 201 may have a thickness capable of exhibiting a destructive interference with light in the visible light wavelength band (for example, T202=λ/4/n, where λ is a wavelength of light and n is a refractive index of the first metal oxide layer 201).

FIG. 6 shows a relationship between the light reflectance of the first metal oxide layer 201 (or the first wiring layer 200 including the first metal oxide layer 201) to light in the visible light wavelength band (for example, a wavelength of 550 nm) and the thickness T201 of the first metal oxide layer 201 in the third direction Z. It is assumed that the first conductive metal layer 202 includes copper (Cu) and the thickness T202 of the first conductive metal layer 202 is 6000 Å.

When the thickness T201 of the first metal oxide layer 201 is 0 Å (that is, when the first wiring layer 200 includes only the first conductive metal layer 202), the light reflectance of the first wiring layer 200 may be 79.6%. That is, most of the light EXL incident from the back surface of the first metal oxide layer 201 is reflected, and may be viewed by the user as reflected light RFL.

As the thickness T201 of the first metal oxide layer 201 increases, the light reflectance of the first metal oxide layer 201 gradually decreases. When the thickness T201 of the first metal oxide layer 201 is 400 Å, the light reflectance of the first metal oxide layer 201 may have a minimum value of 1.7%. As the thickness T201 of the first metal oxide layer 201 increases over 400 Å, the light reflectance of the first metal oxide layer 201 gradually increases. When the thickness T201 of the first metal oxide layer 201 is 650 Å, the light reflectance of the first metal oxide layer 201 may be 17.7%.

Since the light reflectance of the first metal oxide layer 201 is determined by the light absorbance, transmittance, and refractive index of the first metal oxide layer 201 and the destructive interference of transmitted light, at a thickness T201 of 400 Å causing destructive interference, the light reflectance of the first metal oxide layer 201 may have a minimum value. As the thickness T201 increases over 400 Å, the light reflectance of the first metal oxide layer 201 slightly increases, but the light absorbance of the first metal oxide layer 201 increases with the increase of the thickness T201, so that the light reflectance of the first metal oxide layer 201 may be reduced again and saturated.

According to embodiments, the thickness T201 of the first metal oxide layer 201 may be in a range of 100 Å to 2,000 Å where light reflectance is reduced to 50% or less, may be in a range of 300 Å to 550 Å where light reflectance is reduced to 10% or less, and may be about 400 Å where light reflectance is minimized. When the visible light wavelength band is in a range of 380 nm to 780 nm, considering the overall light absorbance and destructive interference, the thickness T201 of the first metal oxide layer 201 may be about 500 Å.

When the thickness T201 of the first metal oxide layer 201 is about 500 Å, the light absorbance of the first metal oxide layer 201 (or the first wiring layer 200 including the first metal oxide layer 201) may be about 40% or more, about 45% or more, about 50% or more, about 55% or more, or about 60% or more. The light reflectance of the first metal oxide layer 201 (or the first wiring layer 200 including the first metal oxide layer 201) itself may be in a range of 25% to 40%, and the light transmittance thereof may be in a range of 15% to 25%.

The side wall of the first metal oxide layer 201 may protrude beyond the side wall of the first conductive metal layer 202 in the second direction Y and/or the first direction X to form a tip T1. The tip T1 of the first metal oxide layer 201 may improve the stability of the first conductive metal layer 202. The width W1 of the surface of the first metal oxide layer 201 facing/contacting the first conductive metal layer 202 (that is, the upper surface of the first metal oxide layer 201 in FIG. 5) may be greater than the width W2 of the surface of the first conductive metal layer 202 facing/contacting the first metal oxide layer 201 (that is, the lower surface of the first conductive metal layer 202 in FIG. 5). The length L1 of the upper side of the tip of the first metal oxide layer 201 may be about 0.5 μm or less. When the length L1 of the tip is greater than 0.5 μm, the leakage current (off current) of a switching element may remarkably, undesirably increase.

The first metal oxide layer 201 may be located at the lowermost layer of the first wiring layer 200. The first metal oxide layer 201 having its own high light absorbance and having a destructive interference thickness is disposed at the lowermost position of the first wiring layer 200, so that the reflectance of the first wiring layer 200 to the light EXL incident from the back surface may be effectively reduced, or the reflected light RFL may be effectively reduced. The reflectance of the first wiring layer 200 to the light EXL having a wavelength of 550 nm incident from the side of the first metal oxide layer 202 (or lower side in the drawing) toward the first wring layer 200 may be about 6.0% or less, about 3.0% or less, or about 1.7% or less. Since the first wiring layer 200 includes the first conductive metal layer 202, it may provide excellent electrical conductivity and may function as a wiring and an electrode.

The first wiring layer 200 may include the gate signal wiring 210 and the sustain electrode 230.

The gate signal wiring 210 extending in the first direction X may completely overlap the line-shaped light blocking member 700 extending in the first direction X. The gate signal wiring 210 may be completely covered and shrouded by the light blocking member 700.

The sustain electrode 230 may partially overlap the light blocking member 700. When the sustain electrode 230 includes a portion extending in the first direction X and a portion extending in the second direction Y, at least a part of the portion of the sustain electrode 230 extending in the second direction Y may be exposed to external light without overlapping the light blocking member 700.

The first wiring layer 200 may have a very low reflectance with respect to light in the visible light wavelength band, and thus the planar area occupied by the light blocking member 700 may be minimized. Even when the light blocking member 700 does not have a portion extending only in the first direction X and not extending in the second direction Y, the display device 1 may have an excellent contrast characteristic. The light blocking member 700 extending in the second direction Y may be absent at the boundary of the adjacent pixels PXa and PXb in the first direction X, so that the aperture ratio of the display device 1 may be improved.

The second wiring layer 500 may include a second metal oxide layer 501 and a second conductive metal layer 502 disposed on the first wiring layer 200 and insulated from the first wiring layer 200.

The second metal oxide layer 501 is substantially the same as or similar to the above-described first metal oxide layer 201, and the second conductive metal layer 502 is substantially the same as or similar to the above-described first conductive metal layer 202.

The first insulating layer 310 may be disposed between the first wiring layer 200 and the second wiring layer 500. The first insulating layer 310 may isolate the second wiring layer 500 from the first wiring layer 200.

The active layer 400 may be disposed between the second wiring layer 500 and the first insulating layer 310. When the second conductive metal layer 501 and the active layer 400 are in contact with each other, the second metal oxide layer 501 may serve as a barrier for preventing ions in the second conductive metal layer 501 from diffusing into the active layer 400. In some embodiments, when the active layer 400 includes amorphous silicon, an ohmic contact layer (not shown) may be further disposed between the second wiring layer 500 and the active layer 400. The ohmic contact layer may include n+ hydrogenated amorphous silicon doped with a high concentration of n-type impurities, or may include a silicide. The ohmic contact layer may reduce a contact resistance between the second wiring layer 500 and the active layer 400.

The second wiring layer 500 may include the data signal wiring 510 and may further include the reference voltage wiring 570.

Each of the data signal wiring 510 and the reference voltage wiring 570, extending in the second direction Y, may partially overlap the light blocking member 700. At least a part of the data signal wiring 510 and the reference voltage wiring 570 may be exposed to external light without overlapping the light blocking member 700.

Similarly to the first wiring layer 200, the second wiring layer 500 may have a very low reflectance with respect to light in the visible light wavelength band, and thus the planar area occupied by the light blocking member 700 may be minimized. Even when the light blocking member 700 does not have a portion extending only in the first direction X and not extending in the second direction Y, the display device 1 may have an excellent contrast characteristic. The light blocking member 700 extending in the second direction Y may be absent at the boundary of the adjacent pixels PXa and PXb in the first direction X, so that the aperture ratio of the display device 1 may be improved.

Figure 7:
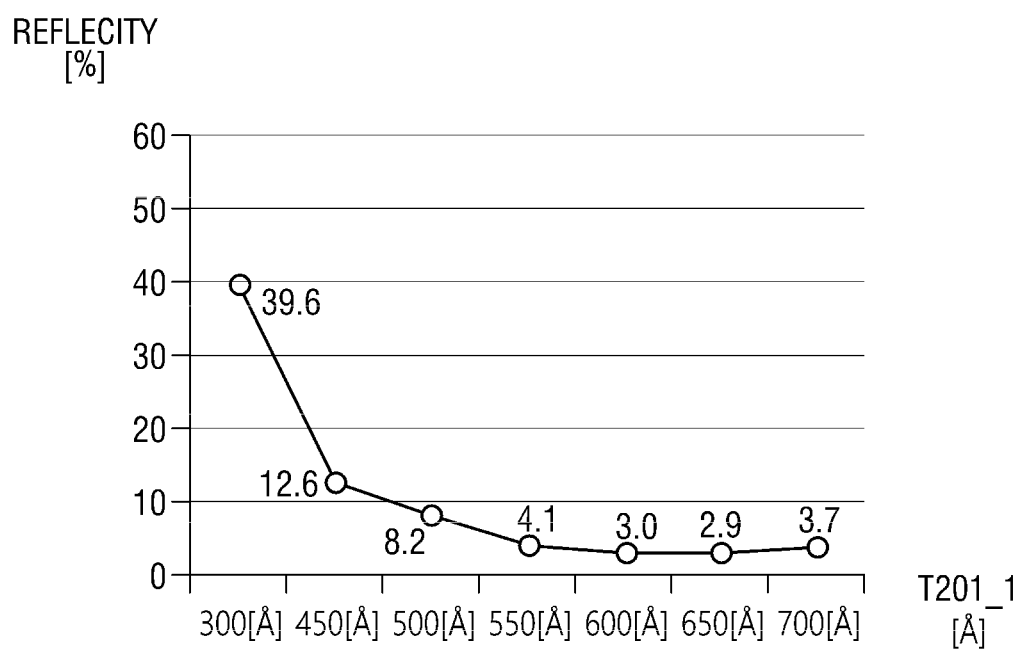
FIG. 7 is a graph showing light reflectance values in a visible light wavelength band with respect to thickness values of a metal oxide layer included in the first wiring layer of FIG. 5 according to an embodiment.

FIG. 7 is a graph showing light reflectance values in a visible light wavelength band with respect to thickness values of a metal oxide layer included in the first wiring layer of FIG. 5 according to an embodiment.

Referring to FIGS. 1 to 5, the first metal oxide layer 201 (and/or the second metal oxide layer 501) may further include tantalum. The first metal oxide layer 201 may include $Mo_xTa_yO_z$.

The content of tantalum in the metal atoms in the first metal oxide layer 201 may be about 20.0 at % (atomic percent) or less, about 12 at % or less, or about 2 at % or less. The uppermost of the ratio ($y/(x+y)$) of y to ($x+y$) may be about 0.20. When the content of tantalum is greater than 20 at %, etching stability deteriorates, and thus it is difficult to control an etching surface.

The lowermost limit of the content of tantalum in the metal atoms in the first metal oxide layer 201 is not particularly limited, but, from the viewpoint of processability, the lowermost limit thereof may be about 0.3 at % or more, or about 0.5 at % or more. When the content of tantalum is less than 0.3 at %, the first metal oxide layer 201 may exhibit undesirable etching characteristics and thus be unstable.

As the content of tantalum increases, the light reflectance of the first metal oxide layer 201 to the visible light wavelength band may increase.

FIG. 7 shows a relationship between the light reflectance of the first metal oxide layer 201 (that is, the first metal oxide layer 201 including tantalum) to the light in the visible light wavelength band (for example, a wavelength of 550 nm) and the thickness T201_1 of the first metal oxide layer 201 in the third direction Z. It is assumed that the first conductive metal layer 202 includes copper (Cu), the thickness T202 of the first conductive metal layer 202 is 6000 Å, and the content of tantalum is about 2.0 at %.

When the thickness T201_1 of the first metal oxide layer 201 is 300 Å, the light reflectance of the first metal oxide layer 201 may be 39.6%, which may be higher than the light reflectance (30.4% shown in FIG. 6) of the first metal oxide layer 201 including no tantalum.

As the thickness T201_1 of the first metal oxide layer 201 increases, the light reflectance of the first metal oxide layer 201 gradually decreases. In this case, when the thickness T201_1 of the first metal oxide layer 201 is 650 Å, the light reflectance of the first metal oxide layer 201 may have a minimum value of 2.9%. As the thickness T201 of the first metal oxide layer 201 increases over 650 Å, the light reflectance of the first metal oxide layer 201 may be gradually increased and then saturated.

According to embodiments, the thickness T201_1 of the first metal oxide layer 201 (including tantalum) may be in a range of 300 Å to 2,000 Å where light reflectance is reduced to 50% or less, may be in a range of 500 Å to 700 Å where light reflectance is reduced to 10% or less, or may be about 600 Å to 650 Å where light reflectance is reduced to 3% or less. Considering the visible light wavelength band about 380 nm to about 780 nm), light absorbance, and destructive interference, or the like, the thickness T201_1 of the first metal oxide layer 201 may be about 600 Å.

When the first metal oxide layer 201 includes tantalum, the tip T1 may be more easily formed on the side wall of the first metal oxide layer 201. The tip T1 of the first metal oxide layer 201 may protrude beyond the side wall of the first conductive metal layer 202 in the second direction Y and/or the first direction X, and may prevent the light reflected by the first conductive metal layer 202 (that is, the light having reached the conductive metal layer 202 and transmitting the first base 110 without passing through the first metal oxide layer 201) from being viewed by the user.

Figure 8:
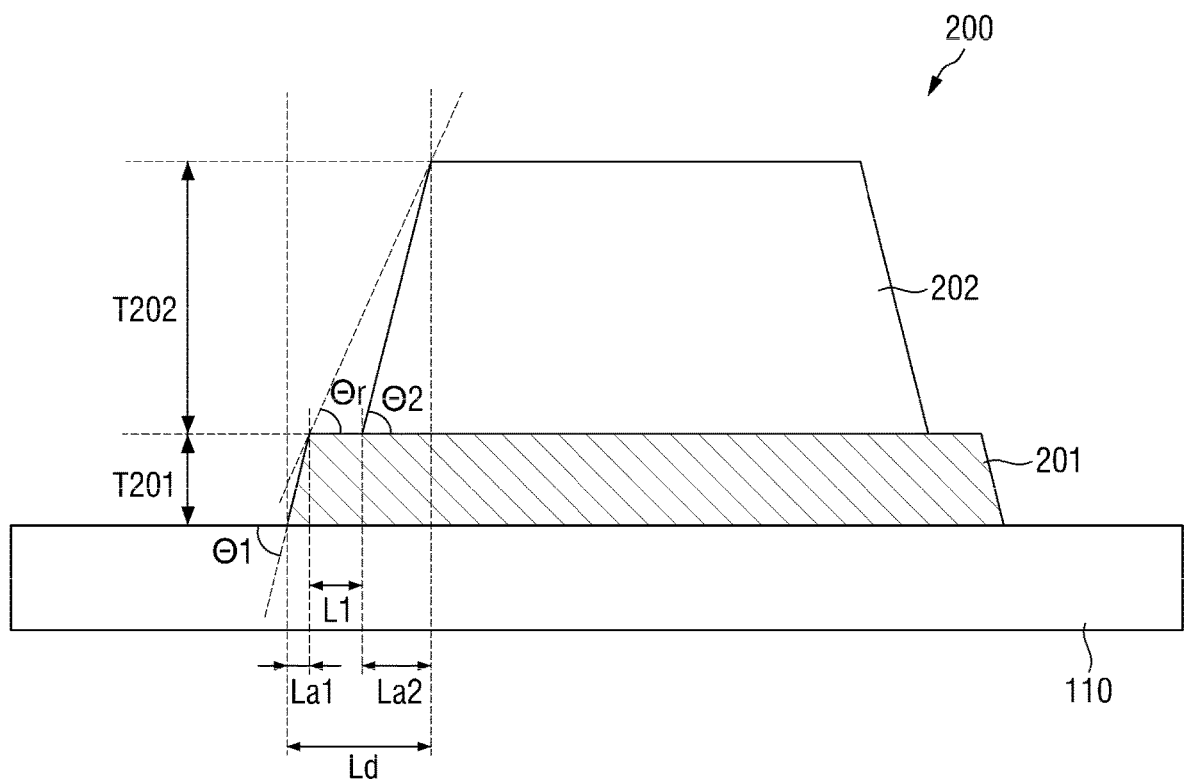
FIG. 8 and FIG. 9 are cross-sectional views showing the first wiring layer of FIG. 5 according to embodiments.
Figure 9:
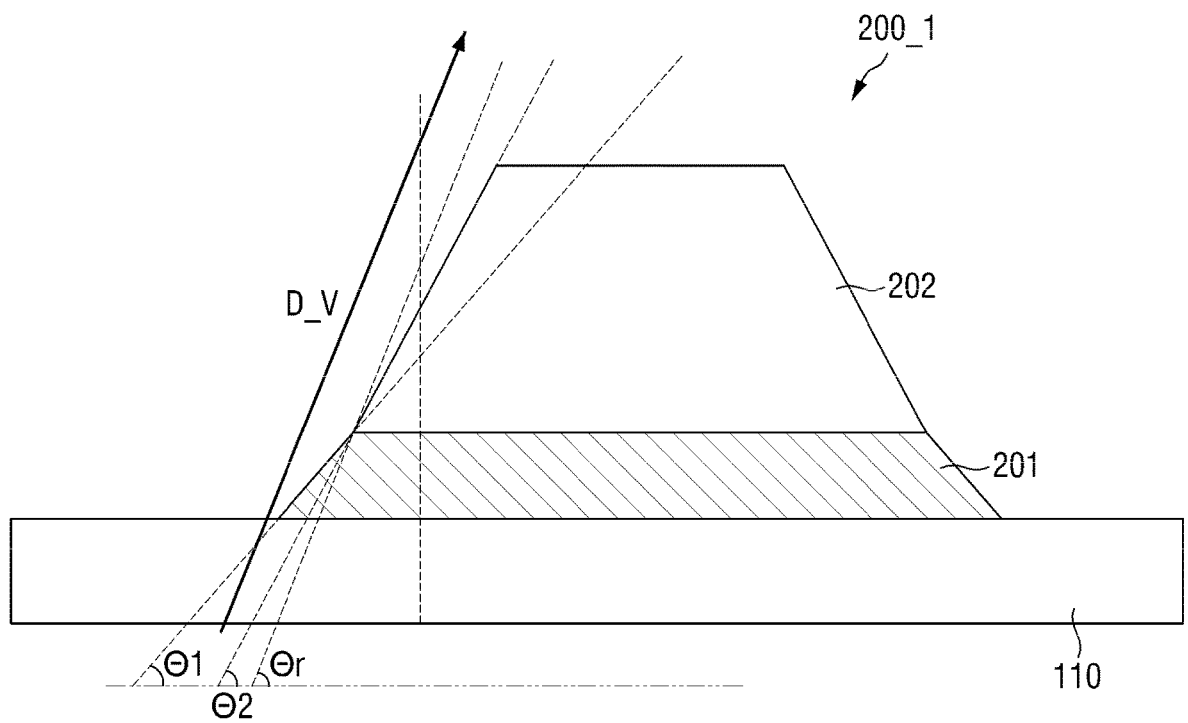

FIGS. 8 and 9 are cross-sectional views showing the first wiring layer of FIG. 5 according to embodiments.

Referring to FIGS. 5 and 8, a first metal oxide layer 201 may have a tapered cross-sectional shape. Both side walls of the first metal oxide layer 201 may be inclined relative to the bottom face of the first base 110, and the distance between the two opposite side walls (or the width of the first metal oxide layer 201 in the horizontal direction) may decrease as a distance from the first base 110 increases. The first conductive metal layer 202 may also have a tapered cross-sectional shape.

The sidewall of the first metal oxide layer 201 may form a first angle $\Theta 1$ (or a first taper angle or a first tilt angle) together with the first base 110, and the sidewall of the first conductive layer 202 may form a second angle $\Theta 2$ (or a second taper angle, a second tilt angle, or a second average angle) together with the first base 110. The first angle $\Theta 1$ and the second angle $\Theta 2$ may be acute angles. Each of the first angle $\Theta 1$ and the second angle $\Theta 2$ may be an angle defined by a line or surface connecting two ends of the side wall when the corresponding side wall is not planar.

The first angle $\Theta 1$ of the sidewall of the first metal oxide layer 201 and the second angle $\Theta 2$ of the sidewall of the second conductive metal layer 202 may be less than or equal to the reference angle $\Theta r$. The reference angle $\Theta r$ is calculated based on the recommended viewing distance (or the minimum viewable distance) of the display device 1, and may be, for example, in a range of 60° to 80°.

For example, when the display device 1 has a rectangular 65-inch display screen, the display device 1 (or the display screen) may have a length of about 1.5 μm and a height of about 0.8 μm depending on an aspect ratio. In this case, the recommended viewing distance for the display device 1 may be about 3.3 μm or more, which is four to eight times the height of the display device 1. When the user is positioned at about 3.3 μm from the display device 1 on a line perpendicular to the display screen and passing through the center point of the display screen, the viewing angle of the user may be about 24.6°. That is, the angle formed by the sight line axis D_V (or sight line direction) of the central user located at the center of the display device 1 with the display device 1 is at least about 77.7° (that is, 90°−24.6°/2=77.7°).

According to embodiments, the first angle $\Theta 1$ of the sidewall of the first metal oxide layer 201 is smaller than 77.7° (that is, the reference angle $\Theta r$), and the second angle $\Theta 2$ of the sidewall of the second conductive metal layer 202 is smaller than 77.7° (that is, the reference angle $\Theta r$), such that the second conductive metal layer 202 may not exposed to the central user, and such that the light reflected by the second conductive metal layer 202 may not be viewed by the user.

When the first angle $\Theta 1$ of the sidewall of the first metal oxide layer 201 is smaller than the second angle $\Theta 2$ of the sidewall of the second conductive metal layer 202, as shown in FIG. 8, the sidewall of the second conductive metal layer 202 may be spaced from the sight line axis D_V, and the conductive metal layer 202 may not be exposed to the central user.

In embodiments, even when the first angle $\Theta 1$ of the sidewall of the first metal oxide layer 201 is greater than 77.7° (that is, the reference angle $\Theta r$), the conductive metal layer 202 may not be exposed to the central user when the first angle $\Theta 1$ of the sidewall of the first metal oxide layer 201 is smaller than the second angle $\Theta 2$ of the sidewall of the conductive metal layer 202.

Since the recommended viewing distance is proportional to the height (or length) of the display device 1, even if the size of the display screen of the display device 1 becomes small, The angle formed by the sight line axis D_V of the central user with the display device 1 may be about 77.7°.

In embodiments, when the user is positioned at about 3.3 μm from the display device 1 on a line perpendicular to the display screen and passing through the boundary of the display screen, the viewing angle of the user may be about 23.7°. That is, the angle formed by the sight line axis D_V (or sight line direction) of the peripheral user located at one side from the center of the display device 1 with the display device 1 is at least about 66.3° (that is, 90°−23.7°=66.3°).

According to embodiments, when the first angle $\Theta 1$ of the sidewall of the first metal oxide layer 201 is smaller than 66.3° and the second angle $\Theta 2$ of the sidewall of the conductive metal layer 202 is smaller than 66.3°, the conductive metal layer 202 may not exposed to the central user.

As the second angle $\Theta 2$ of the sidewall of the conductive metal layer 202 decreases, the width W2 of the conductive metal layer 202 is required to increase, or the thickness T202 of the conductive metal layer 202 is required to decrease. Considering the case where the width W2 of the conductive metal layer 202 is at least about 3 μm and the thickness thereof is at least about 0.6 μm, the second angle $\Theta 2$ of the sidewall of the conductive metal layer 202 may be 45° or more.

The angle (or reference angle $\Theta r$) formed by the sight line axis D_V of the user with the display screen may be about 77.7° or less depending on the position of the user with respect to the display device 1 (or the display screen of the display device 1). Accordingly, the second angle $\Theta 2$ of the sidewall of the conductive metal layer 202 may be about 75° or less, or may be about 66.3° or less, about 60° or less, or about 50° or less, and about 30° or more, considering the peripheral user as well as the central user.

Further, when the first angle $\Theta 1$ of the sidewall of the first metal oxide layer 201 is smaller than the reference angle $\Theta r$, the first angle $\Theta 1$ of the sidewall of the first metal oxide layer 201 may be smaller than the second angle $\Theta 2$ of the sidewall of the conductive metal layer 202.

In embodiments, the first angle Θ1 of the sidewall of the first metal oxide layer 201 may be greater than the reference angle Θr.

Referring to FIGS. 5, 8, and 9, a first metal oxide layer 201 is different from the first metal oxide layer 201 described with reference to FIG. 8 in that it further includes a tip T1 protruding beyond the side wall of the first conductive metal layer 202. Since the first metal oxide layer 201 is substantially the same as the first metal oxide layer 201 described with reference to FIG. 8 except for the tip T1.

The length L1 of the tip T1 may be 0.5 μm or less. Since the thickness T201 of the first metal oxide layer 201 is at a level of several hundred angstroms, such as 400 Å and 600 Å, the protruding length La1 of the first metal oxide layer 201 at the first angle Θ1 is much smaller than the length L1 of the tip T1, so that the protruding length La1 may not be considered in the calculation of the second angle Θ2.

Since the thickness T202 of the first conductive metal layer 202 is several thousand Å to 20000 Å, the distance difference Ld (or L1+La2) between the lower surface of the first metal oxide layer 201 and the upper surface of the conductive metal layer 202 may be about 0.43 μm (that is, 2 μm/tan 77.7°=0.43 μm) depending on the maximum angle 77.7° of the reference angle Θr. Accordingly, the length difference La2 between the upper surface and lower surface of the first conductive metal layer 202 by inclination may be substantially equal to or greater than 0. Therefore, the second angle Θ2 of the first conductive metal layer 202 may be smaller than 90°.

When the side wall of the first metal oxide layer 201 protrudes from the side wall of the first conductive metal layer 202 to form the tip T1, the second angle Θ2 of the sidewall of the first conductive metal layer 202 may be greater than the reference angle Θr. Even in this case, the conductive metal layer 202 and the light reflected thereby may not be viewed by the user.

Figure 10:
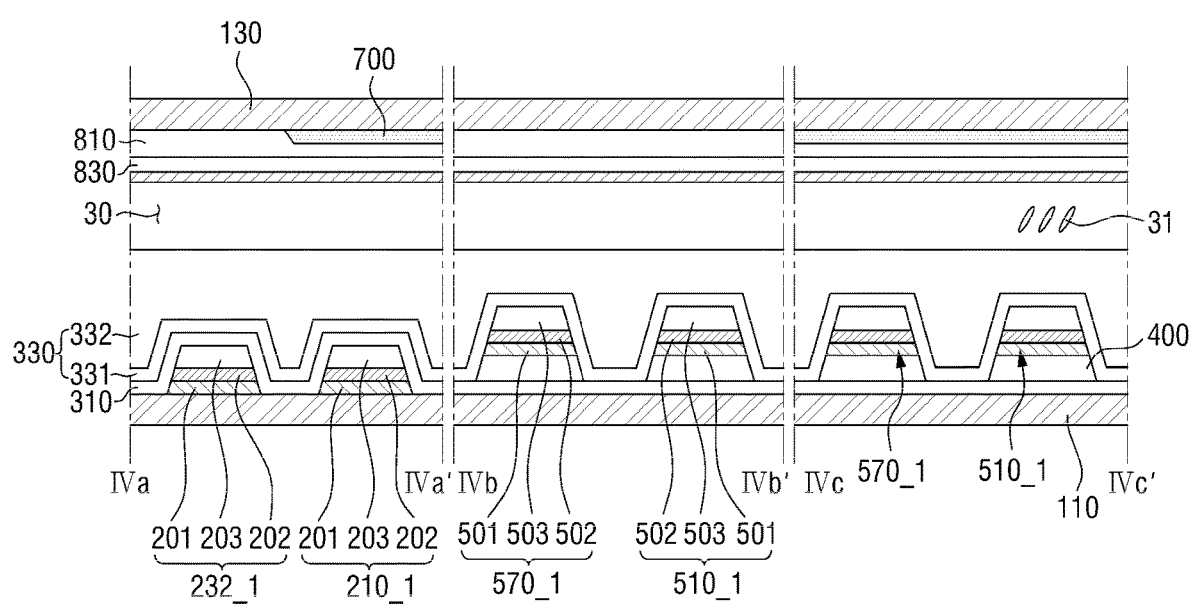
FIG. 10 is a cross-sectional view showing a first wiring layer and a second wiring layer included in the pixels of FIG. 2 according to an embodiment.

FIG. 10 is a cross-sectional view showing a first wring layer and a second wiring layer included in the pixel of FIG. 2 according to an embodiment.

Referring to FIGS. 1, 2, 4, and 10, a first wiring layer 200 (or a gate wiring 210_1 and extending portions 232_1) is different from the first wiring layer 200 described with reference to FIG. 4 in that it further includes a first intermediate metal layer 203 disposed between the first metal oxide layer 201 and the first conductive metal layer 202. Similarly, a second wiring layer 500 (or a data wiring 510_1 and a reference voltage wiring 570_1) is different from the second wiring layer 500 described with reference to FIG. 4 in that it further includes a second bonding metal layer 503 disposed between the second metal oxide layer 501 and the second conductive metal layer 502.

The first intermediate metal layer 203 may include a metal material having an excellent adhesion to the first metal oxide layer 201, and may be disposed on the first metal oxide layer 201. For example, the first intermediate metal layer 203 may include a refractory metal having excellent processability. As used herein, the 'refractory metal' refers to a metal or alloy having a melting point higher than 1500° C. Examples of the refractory metal include niobium (Nb), vanadium (V), tantalum (Ta), titanium (Ti), zirconium (Zr), hafnium (Hf), molybdenum (Mo), and rhenium (Re). For example, the first intermediate metal layer 203 may be a titanium layer including titanium, or may be a single layer including an alloy of titanium. The first intermediate metal layer 203 may exhibit opaque properties.

The second intermediate metal layer 503 is substantially the same as the first intermediate metal layer 203.

Figure 11:
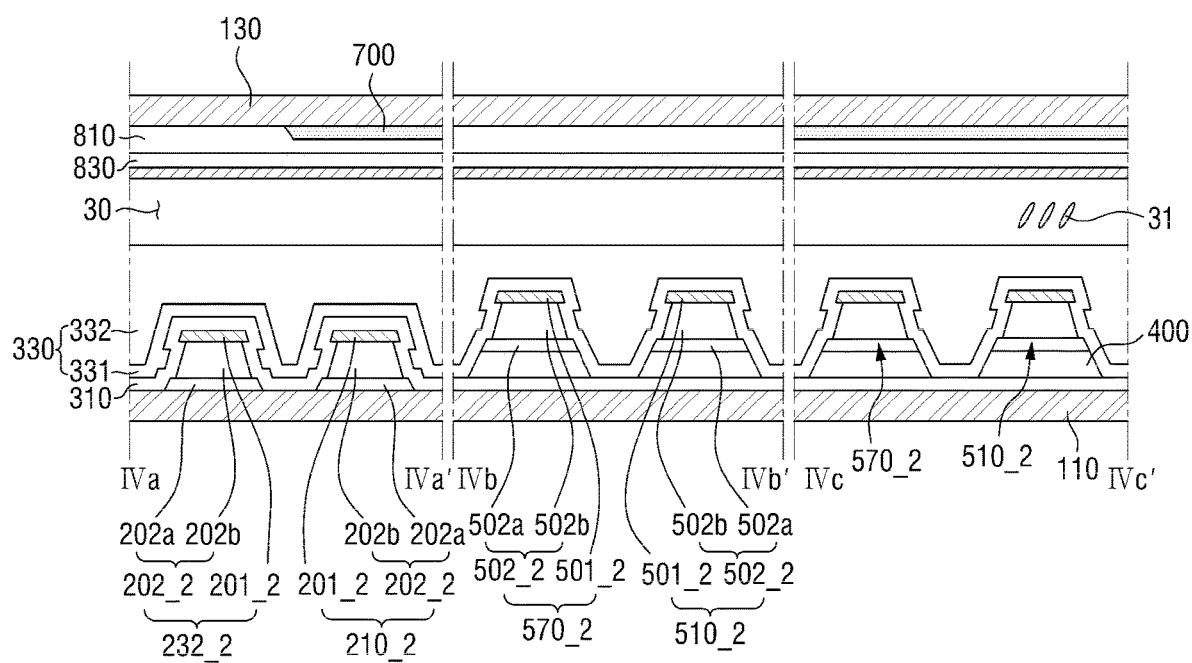
FIG. 11 and FIG. 12 are cross-sectional views showing a first wring layer and a second wiring layer included in the pixel of FIG. 2 according to embodiments.
Figure 12:
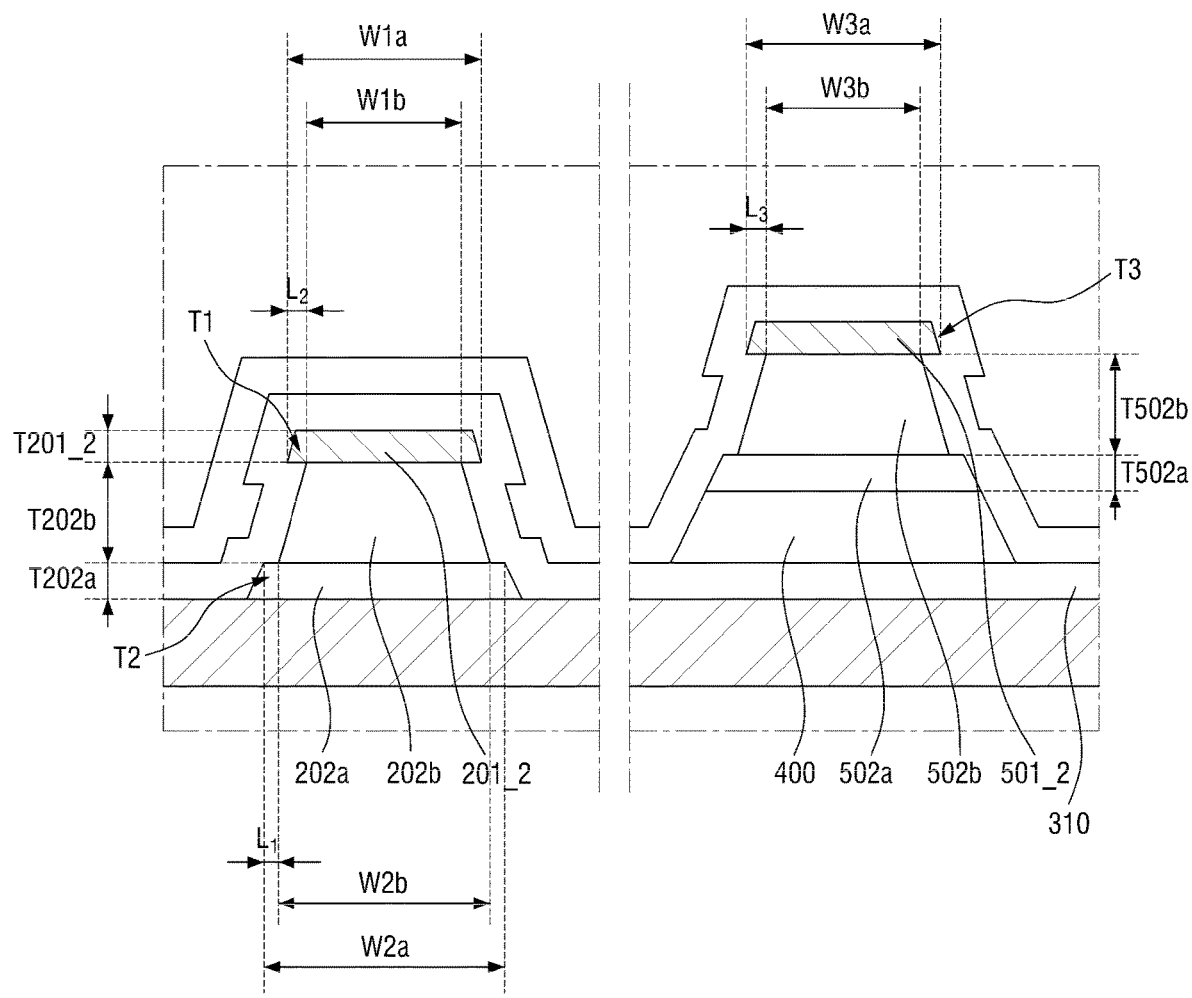

FIGS. 11 and 12 are cross-sectional views showing a first wring layer and a second wiring layer included in the pixel of FIG. 2 according to embodiments.

Referring to FIGS. 1, 2, 4, 5, 11, and 12, a first wiring layer 200 (or a gate wiring 210_2 and extending portions 232_2) is different from the first wiring layer 200 described with reference to FIG. 4 in that it further includes a first metal oxide layer 201_2 and a first conductive metal layer 202_2. Similarly, a second wiring layer 500 (or a data wiring 510_2 and a reference voltage wiring 570_2) is different from the second wiring layer 500 described with reference to FIG. 4 in that it further includes a second metal oxide layer 501_2 and a second conductive metal layer 502_2.

The first conductive metal layer 202_2 may be disposed on the first base 110. The first conductive metal layer 202_2 may have a laminate structure of two or more layers. For example, the first conductive metal layer 202_2 may include a first metal layer 202a and a second metal layer 202b that are mutually laminated.

The first metal layer 202a may include a metal material having an excellent adhesion to the first base 110, and may be disposed directly on the first base 110. The first metal layer 202a may be substantially the same as the first intermediate metal layer 203 described with reference to FIG. 10, except for layout.

The second metal layer 202b may be disposed directly on the first metal layer 202a. The second metal layer 202b may be located on the uppermost layer of the first conductive metal layer 202_2 having a laminate structure of a plurality of layers. The second metal layer 202b may be substantially the same as the first conductive metal layer 202 described with reference to FIG. 4.

In an embodiment, the first metal layer 202a may be made of a metal material having a refractive index higher than that of the second metal layer 202b. For example, the refractive index of the first metal layer 202a to light in the visible light wavelength band may be in a range of 1.5 to 2.8, and the refractive index of the second metal layer 202b to light in the visible light wavelength band may be in a range of 0.20 to 1.2. For example, the refractive index of the first metal layer 202a to light having a wavelength of 550 nm may be in a range of 2.3 to 2.6 or about 2.5, and the refractive index of the second metal layer 202b to light having a wavelength of 550 nm may be in a range of 0.8 to 1.2 or about 1.0.

The thickness T202b of the second metal layer 202b may be greater than the thickness T202a of the first metal layer 202a. For example, the thickness T202a of the first metal layer 202a may be in a range of 5 Å to 500 Å or in a range of 100 Å to 300 Å, and the thickness T202b of the second metal layer 202b may be in a range of 1,000 Å to 2,000 Å or in a range of 5,000 Å to 10,000 Å.

The side wall of the first metal layer 202a may protrude beyond the side wall of the second metal layer 202b to form a tip T2. The tip T2 of the first metal layer 202a may improve the stability of the second metal layer 202b. For example, the width W2a of the surface of the first metal layer 202a facing/contacting the second metal layer 202b may be greater than the width W2b of the surface of the second metal layer 202b facing/contacting the first metal layer 202a. The length L2 of the upper side of the tip of the first metal layer 202a may be about 0.5 μm or less. When the length L2 of the tip T2 is greater than 0.5 μm, the leakage current (off current) of a switching element may remarkably, undesirably increase.

The first metal oxide layer 201_2 may be a single layer disposed directly on the second metal layer 202b. The first metal oxide layer 201_2 may include a material having larger light absorbance and smaller light reflectance than the first conductive metal layer 202_2. The first metal oxide layer 201_2 may have larger light absorbance and smaller light reflectance than each of the first metal layer 202a and the second metal layer 202b. The first metal oxide layer 201_2 may be substantially the same as the first metal oxide layer 201 described with reference to FIG. 4.

In an embodiment, the first metal oxide layer 201_2 may include $Mo_xTa_yO_z$.

The content of tantalum in the metal atoms in the first metal oxide layer 201_2 may be about 20.0 at % (atomic percent) or less, about 12 at % or less, or about 2 at % or less. That is, the uppermost of the ratio (y/(x+y)) of y to (x+y) may be about 0.20. When the content of tantalum is greater than 20 at %, etching stability deteriorates, and thus it is difficult to control an etching surface. For example, the tip T1 of the first metal oxide layer 201_2 may become excessively long.

As the content of tantalum increases, the light reflectance of the first metal oxide layer 201_2 to the visible light wavelength band may increase as described with reference to FIG. 7.

In an embodiment, the sidewall of the first metal oxide layer 201_2 may protrude beyond the sidewall of the second metal layer 202b to form a tip T1. The tip T1 of the first metal oxide layer 201_2 may contribute to a decrease in the reflectance on the upper side of the first wiring layer 200_2. For example, the width W1a of the surface of the first metal oxide layer 201_2 facing/contacting the second metal layer 202b may be greater than the width W1b of the surface of the second metal layer 202b facing/contacting the first metal oxide layer 201_2. The length L1 of the lower side of the tip T1 of the first metal oxide layer 201_2 may be about 0.80 μm or less. When the length L of the tip T1 is greater than 0.80 μm, the subsequent processability after forming the first wiring layer 200_2 may be deteriorated. For example, when the length L1 of the tip T1 of the first metal oxide layer 201_2 is less than 0.80 μm, the film compactness of the first insulating layer 310 may be improved. Further, the length L of the tip may be about 0.03 μm or more. When the length L1 of the tip T1 of the first metal oxide layer 201_2 is greater than 0.03 μm, it may be effective to reduce the reflectance of the first wiring layer 200_2.

The first metal oxide layer 201_2 may be located at the uppermost layer of the first wiring layer 200. The first metal oxide layer 201_2 having its own high light absorbance and having a destructive interference thickness, so that the reflectance of the first wiring layer 200 to the light EXL incident from above may be effectively reduced. In embodiments, the reflectance of the first wiring layer 200_2 to the light EXL having a wavelength of 550 nm incident from the side of the first metal oxide layer 201_2 toward the first wring layer 200_1 may be about 6.0% or less, about 5.5% or less, about 5.4% or less, about 5.3% or less, about 5.2% or less, about 5.1% or less, or about 5.0% or less. Since the first wiring layer 200_1 includes the first conductive metal layer 202_2, it may provide excellent electrical conductivity and may function as a wiring and an electrode.

The second wiring layer 500_2 may be substantially the same as the first wiring layer 200_2, except that it is disposed on the first insulating layer 310 and the active layer 400.

The first wiring layer 200_2 and the second wiring layer 500_2 may have very low reflectance with respect to the visible light wavelength band, so that the planar area occupied by the light blocking member 700 may be minimized, and thus the aperture ratio of the display device may be maximized.

The display device according to the embodiments includes a wiring layer including molybdenum oxide ($MoO_x$, $Mo_xTa_yO_z$) having very low reflectance for a visible light wavelength band, thereby minimizing deterioration of display quality potentially caused by reflection of external light. The second wiring layer 500_2 may be substantially the same as the first wiring layer 200_2, except that it is disposed on the first insulating layer 310 and the active layer 400. The second conductive metal layer 502_2 may be disposed on the active layer 400. The second conductive metal layer 502_2 may have a laminate structure of two or more layers. For example, the second conductive metal layer 502_2 may include a first metal layer 502a and a second metal layer 502b that are mutually laminated. The second metal layer 502b may be disposed directly on the first metal layer 502a. The second metal layer 502b may be located on the uppermost layer of the second conductive metal layer 502_2 having a laminate structure of a plurality of layers. The second metal layer 502b may be substantially the same as the second conductive metal layer 502 described with reference to FIG. 4.

In an embodiment, the first metal layer 502a may be made of a metal material having a refractive index higher than that of the second metal layer 502b. For example, the refractive index of the first metal layer 502a to light in the visible light wavelength band may be in a range of 1.5 to 2.8, and the refractive index of the second metal layer 502b to light in the visible light wavelength band may be in a range of 0.20 to 1.2. For example, the refractive index of the first metal layer 502a to light having a wavelength of 550 nm may be in a range of 2.3 to 2.6 or about 2.5, and the refractive index of the second metal layer 502b to light having a wavelength of 550 nm may be in a range of 0.8 to 1.2 or about 1.0.

The thickness T502b of the second metal layer 502b may be greater than the thickness T502a of the first metal layer 502a. For example, the thickness T502a of the first metal layer 502a may be in a range of 5 Å to 500 Å or in a range of 100 Å to 300 Å, and the thickness T502b of the second metal layer 502b may be in a range of 1,000 Å to 2,000 Å or in a range of 5,000 Å to 10,000 Å.

The second metal oxide layer 501_2 may be a single layer disposed directly on the second metal layer 502b. The second metal oxide layer 501_2 may include a material having larger light absorbance and smaller light reflectance than the second conductive metal layer 502_2. The second metal oxide layer 501_2 may have larger light absorbance and smaller light reflectance than each of the first metal layer 502a and the second metal layer 502b. The second metal oxide layer 501_2 may be substantially the same as the second metal oxide layer 501 described with reference to FIG. 4.

In an embodiment, the sidewall of the second metal oxide layer 501_2 may protrude beyond the sidewall of the second metal layer 502b to form a tip T3. The tip T3 of the second metal oxide layer 501_2 may contribute to a decrease in the reflectance on the upper side of the second wiring layer 500_2. For example, the width W3a of the surface of the second metal oxide layer 501_2 facing/contacting the second metal layer 502b may be greater than the width W3b of the surface of the second metal layer 502b facing/contacting the second metal oxide layer 501_2. The length L3 of the lower side of the tip T3 of the second metal oxide layer 501_2 may be about 0.80 μm or less. When the length L3 of the tip T3 is greater than 0.80 μm, the subsequent processability after forming the second wiring layer 500_2 may be deteriorated. For example, when the length L3 of the tip T3 of the second metal oxide layer 501_2 is less than 0.80 µm, the film compactness of the protective layer 331 may be improved. Further, the length L3 of the tip may be about 0.03 µm or more. When the length L3 of the tip T3 of the second metal oxide layer 501_2 is greater than 0.03 µm, it may be effective to reduce the reflectance of the second wiring layer 500_2.

In embodiments, since the reflectance of the wiring layer itself is very low, the planar area occupied by a light blocking member can be minimized, so that the aperture ratio of the display device can be maximized, and the resolution of the display device can be further improved.

Although example embodiments have been disclosed for illustrative purposes, those skilled in the art will appreciate that various modifications, additions, and substitutions are possible without departing from the scope defined in the accompanying claims.

What is claimed is:

1. A display device, comprising:
   a first base;
   a metal oxide layer overlapping a face of the first base;
   a semiconductor material layer spaced from the metal oxide layer; and
   a conductive metal layer directly contacting the metal oxide layer and spaced from the semiconductor material layer,
   wherein the metal oxide layer includes molybdenum oxide and protrudes beyond the conductive metal layer in a direction parallel to the face of the substrate,
   wherein a side of the metal oxide layer is oriented at a first angle relative to the face of the first base,
   wherein a side of the conductive metal layer is oriented at a second angle relative to the face of the first base, and
   wherein a size of the second angle is in a range of 30° to 75°.

2. The display device of claim 1,
   wherein a light reflectance of the metal oxide layer is lower than a light reflectance of the conductive metal layer.

3. The display device of claim 2,
   wherein a first wiring layer of the display device comprises the metal oxide layer and the conductive metal layer, and
   wherein a light reflectance of the first wring layer to light having a wavelength of 550 nm incident from the face of the first base is 6.0% or less.

4. The display device of claim 3,
   wherein a maximum thickness of the metal oxide layer in a direction perpendicular to the face of the first base is in a range of 100 Å to 2000 Å.

5. The display device of claim 1,
   wherein the conductive metal layer includes a first metal layer and a second metal layer,
   wherein the first metal layer is disposed between the metal oxide layer and the second metal layer, and
   wherein the second metal layer has higher electrical conductivity than the first metal layer.

6. The display device of claim 5,
   wherein a first wiring layer of the display device comprises the metal oxide layer and the conductive metal layer, and
   wherein a light reflectance of the first wring layer to light having a wavelength of 550 nm incident from the face of the metal oxide layer is 6.0% or less.

7. The display device of claim 1,
   wherein the conductive metal layer includes a first metal layer and a second metal layer, and
   wherein the second metal layer is disposed between the first metal layer and the metal oxide layer and has higher electrical conductivity than the first metal layer.

8. The display device of claim 7,
   wherein a maximum thickness of the metal oxide layer in a direction perpendicular to the face of the first base is greater than a maximum thickness of the first metal layer in the direction perpendicular to the face of the first base and is smaller than a maximum thickness of the second metal layer in the direction perpendicular to the face of the first base.

9. The display device of claim 8,
   wherein the maximum thickness of the metal oxide layer in the direction perpendicular to the face of the first base is in a range of 100 Å to 2000 Å.

10. The display device of claim 7,
    wherein the first metal layer includes a refractory metal, and
    wherein the second metal includes at least one of copper and silver.

11. The display device of claim 7,
    wherein a first face of the first metal layer and a first face of the second metal layer are positioned between a second face of the first metal layer and a second face of the second metal layer, and
    wherein the first face of the first metal layer is wider that the first face of the second metal layer in the direction parallel to the face of the first base.

12. The display device of claim 7,
    wherein the metal oxide layer directly contacts a face of the conductive metal layer and protrudes beyond the face of the conductive metal layer in the direction parallel to the face of the first base.

13. The display device of claim 1,
    wherein a side of the conductive metal layer is oriented at an angle relative to the face of the first base and directly contacts a portion of a flat side of the metal oxide layer,
    wherein the portion of the flat side of the metal oxide layer is positioned between two opposite sides of the metal oxide layer and is positioned between two opposite edges of the flat side of the metal oxide layer,
    wherein each of the two opposite sides of the metal oxide layer is directly connected to the flat side of the metal oxide layer,
    wherein the face of the first base is equidistant from the two opposite sides of the metal oxide layer, and
    wherein a size of the angle is in a range of 30° to 75°.

14. A display device, comprising:
    a first base;
    a metal oxide layer overlapping a face of the first base;
    a semiconductor material layer overlapping the metal oxide layer and spaced from the metal oxide layer; and
    a conductive metal layer directly contacting the metal oxide layer and spaced from the semiconductor material layer,
    wherein the metal oxide layer includes molybdenum oxide,
    wherein a side of the metal oxide layer is oriented at a first angle relative to the face of the first base,
    wherein a side of the conductive metal layer is oriented at a second angle relative to the face of the first base,
    wherein a size of the second angle is in a range of 30° to 75°, and wherein the metal oxide layer is disposed directly on the first base and disposed between the conductive metal layer and the first base.

15. The display device of claim 14, wherein the first angle is smaller than the second angle.

16. The display device of claim 15, wherein the size of the second angle is in a range of 45° to 70°.

17. The display device of claim 14, wherein the metal oxide layer directly contacts a face of the conductive metal layer and protrudes beyond the face of the conductive metal layer in a direction parallel to the face of the first base.

18. The display device of claim 14, wherein the metal oxide layer further includes tantalum, and
wherein a content of the tantalum in metal atoms is in a range of 0.5 at % to 12 at % in the metal oxide layer.

19. The display device of claim 14,
wherein the conductive metal layer includes a first metal layer and a second metal layer,
wherein the first metal layer is disposed between the metal oxide layer and the second metal layer, and
wherein the second metal layer has higher electrical conductivity than the first metal layer.

20. A display device, comprising:
a first base;
a conductive metal layer overlapping a face of the first base; and
a metal oxide layer directly contacting the conductive metal layer,
wherein the metal oxide layer includes $Mo_xTa_yO_z$,
wherein a side of the conductive metal layer is oriented at an acute angle relative to the face of the first base, and
wherein a content of tantalum in metal atoms is in a range of 0.5 at % to 20 at % in the metal oxide layer.

* * * * *